(12) United States Patent
Fukui et al.

(10) Patent No.: US 7,905,112 B2
(45) Date of Patent: *Mar. 15, 2011

(54) REFORMING PROCESS OF QUARTZ GLASS CRUCIBLE

(75) Inventors: Masanori Fukui, Akita (JP); Masaru Satoh, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 407 days.

This patent is subject to a terminal disclaimer.

(21) Appl. No.: 10/628,350

(22) Filed: Jul. 29, 2003

(65) Prior Publication Data

US 2004/0050099 A1   Mar. 18, 2004

(51) Int. Cl.
*C03B 19/00* (2006.01)
(52) U.S. Cl. .......................................... 65/17.6; 65/17.3
(58) Field of Classification Search ................. 65/17.6, 65/17.3
See application file for complete search history.

(56) References Cited

U.S. PATENT DOCUMENTS

| | | | |
|---|---|---|---|
| 2,089,690 A | 8/1937 | Cornelius | |
| 2,993,079 A | 7/1961 | Augsburger | |
| 3,422,206 A * | 1/1969 | Baker et al. | 75/10.19 |
| 3,520,979 A | 7/1970 | Scarfe et al. | |
| 3,806,621 A * | 4/1974 | Machlan | 373/41 |
| 3,997,316 A * | 12/1976 | Koontz | 65/135.6 |
| 4,531,218 A * | 7/1985 | Williamson | 373/39 |
| 4,956,208 A | 9/1990 | Uchikawa et al. | |
| 5,308,446 A | 5/1994 | Bihuniak et al. | |
| 5,364,426 A * | 11/1994 | Richards | 65/474 |
| 6,044,667 A * | 4/2000 | Chenoweth | 65/540 |
| 6,553,787 B1 * | 4/2003 | Akiho et al. | 65/17.3 |
| 6,853,673 B2 * | 2/2005 | Fukui et al. | 373/62 |
| 6,886,364 B2 * | 5/2005 | Ohama et al. | 65/17.3 |
| 2003/0113449 A1 * | 6/2003 | Tsuji et al. | 427/231 |
| 2004/0050099 A1 | 3/2004 | Fuku et al. | |
| 2010/0071613 A1 * | 3/2010 | Kishi et al. | 117/208 |

FOREIGN PATENT DOCUMENTS

EP    1 002 770 A2    5/2000

(Continued)

OTHER PUBLICATIONS

U.S. Appl. No. 10/383,608, filed Mar. 10, 2003, Fukui et al.

(Continued)

*Primary Examiner* — Queenie Dehghan
(74) *Attorney, Agent, or Firm* — Oblon, Spivak, McClelland, Maier & Neustadt, L.L.P.

(57) ABSTRACT

A reforming process of a quartz glass crucible in which the quartz glass crucible is reformed by an arc discharge generated by electrodes positioned around a rotational axis and configured to heat an inside surface of the crucible while the crucible is rotated. The process includes arranging electrodes in an electrode structure such that neighboring electrodes are positioned at regular intervals in a ring-like configuration; forming a stable ring-like arc between the neighboring electrodes, without generating a continuous arc between electrodes facing each other across a central portion of the ring-like configuration; heating the inside surface of the crucible; and removing a foreign substance located on the inside surface of the crucible or a bubble located under the inside surface of the crucible.

14 Claims, 3 Drawing Sheets

FOREIGN PATENT DOCUMENTS

| | | |
|---|---|---|
| JP | 56-31188 | 7/1981 |
| JP | 1-148718 | 6/1989 |
| JP | 02-188489 | 7/1990 |
| JP | 02188489 A * | 7/1990 |
| JP | 08-012359 | 1/1996 |
| JP | 10-017391 | 1/1998 |
| JP | 11-236233 | 8/1999 |
| JP | 2001002430 A * | 1/2001 |
| JP | 2001-342029 | 12/2001 |

OTHER PUBLICATIONS

B. Cockayne, et al., "Technologies for removing solidified melts from precious metal crucibles subsequent to Czochralski growth", Journal of Crystal Growth, XP 000468431, vol. 142, No. 3/4, Sep. 2, 1994, pp. 357-361.

Kanda et al., "Quartz Crucible Production in Mitsubishi Materials Quartz Akita Plant," Metallurgical Review of MMIJ, vol. 17, No. 1, Jul. 2000.

* cited by examiner

Electrode

Crucible

[Figure 6]

REFORMING PROCESS OF QUARTZ GLASS CRUCIBLE

CROSS-REFERENCE TO RELATED APPLICATIONS

The present application claims priority to the earlier filing date of Japanese Application Serial No. 2002-237039, filed Aug. 15, 2002, and Japanese Application Serial No. 2003-021196, filed Jan. 29, 2003, the entire contents of which are hereby incorporated by reference herein.

BACKGROUND OF THE INVENTION

1. Field of the Invention

The present invention relates to a reforming process of a quartz glass crucible for pulling up single crystal silicon by a ring-like arc discharge, which is especially suitable to reform the crucible having a large open diameter.

2. Discussion of the Background

When single crystal silicon is pulled up from molten silicon, a quartz glass crucible has been used as the vessel to take in the molten silicon. Conventionally, the crucible is produced by fusing a quartz powder using an arc flame. However, there are problems in that silicon oxide ($SiO_2$, SiO, etc.) evaporated during the fusing is condensed again to fall down on the inside surface of the crucible and to form a foreign substance, or a metal powder (impurity), or a substance other than silica is adhered and included on the inside surface of the crucible to form a foreign substance. Moreover, a bubble included near the inside surface of the crucible is often expanded to burst to form an irregularity on the inside surface. When the foreign substance or irregularity exists on the inside surface of the quartz glass crucible, or the bubble exists under the inside surface, a reforming treatment, in which the inside surface is re-fused to remove the foreign substance or the bubble, has been carried out. Conventionally, in the reforming treatment, the arc discharge used for the production of the crucible is used as the means for heating the inside surface of the crucible.

The conventional electrode structure forming the arc discharge is a structure having 3 electrodes with 3-phase alternating current, in general, in which 3 electrodes are used, and the 3-phase alternating electric current flows to the 3 electrodes to form the arc (discharge) plasma between each of the electrodes. However, the structure has a fault in that the arc becomes unstable to be cut off when a distance between the electrodes is increased in order to expand the heating range. Especially, for a large crucible, when the influence of an air stream on the inside of the crucible created by the rotation of the mould becomes large, the arc is cut off easily in the conventional electrode structure.

Figure 6:
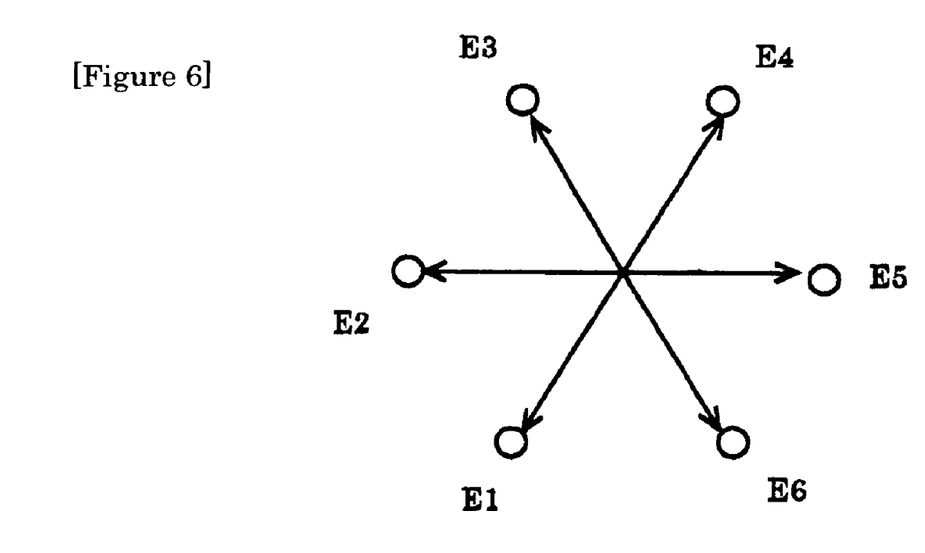
FIG. 6 shows a conventional electrode structure.

Therefore, trials increasing the number of electrodes to expand the heating range have been carried out, and a structure having 6 electrodes with 6-phase alternating current has been proposed. However, for the structure having 6 electrodes with 6-phase current, as shown in FIG. 6, it is easy to generate an arc discharge between the electrodes facing each other, rather than between the electrodes neighboring each other, so that there is a problem that the heat of discharge at the central portion encircled by the electrodes becomes excessively large rather than the heat around the outside portion. Accordingly, it is difficult to heat uniformly the inside of the crucible.

Moreover, although the arc can be inclined in order to heat the wall portion, the arc becomes unstable easily and the device becomes complicated using the conventional electrode structure. In addition, although an oxyhydrogen flame or a plasma flame is suitable for a partial heating, the reformed face becomes non-uniform easily because of the partial heating, and the required treatment time is also long. Moreover, when the partial heating is carried out, it is necessary to also carry out annealing, and if the annealing is not carried out, there is a problem that the crucible is broken when cooled. Furthermore, as for the heating by an oxyhydrogen flame, a concentration of an OH group at the heating portion becomes high, so it is not preferable.

SUMMARY OF THE INVENTION

The present invention solves the above-noted problems of the conventional electrode structure in the production device of the quartz glass crucible. In addition, the present invention provides the reforming process of the quartz glass crucible according to an electrode structure forming a ring-like arc, which is stable and has a large heating range, and is suitable for the production of the crucible having a large open diameter.

An object of the present invention is to provide a reforming process of a quartz glass crucible, in which it is possible to obtain an excellent reformed crucible even when the crucible is large in size.

That is, the present invention relates to the following reforming process of the quartz glass crucible.

A reforming process of a quartz glass crucible, wherein the quartz glass crucible is reformed by an arc discharge generated by electrodes positioned around a rotational axis to heat an inside surface of the crucible to be fused while rotating said quartz glass crucible, the process comprising: arranging the electrodes in an electrode structure in which neighboring electrodes are positioned at regular intervals from each other in a ring-like configuration; forming a stable ring-like arc between the neighboring electrodes, without generating a continuous arc between electrodes facing each other across a central portion of the ring-like configuration; heating the inside surface of the crucible; and removing a foreign substance located on the inside surface or a bubble located under the inside surface.

According to the reforming process of the present invention, although the ring-like arc discharge generated between the electrodes neighboring each other at both sides is formed, the stable arc discharge is not formed substantially between the electrodes facing each other across the central portion of the ring. Therefore, the central portion encircled with the electrodes is not heated excessively, and it is possible to heat uniformly the inside of the crucible. Moreover, in order to expand the heating range, only the distance between the electrodes neighboring each other can be increased within a range in which the arc discharge is possible, so that it is possible to heat uniformly the crucible having a large open diameter, and to obtain an excellent reformed crucible, in which the whole inside surface of the crucible is refused uniformly.

The above-described production process of the present invention includes the following production processes.

A reforming process of the quartz glass crucible, the process comprising: arranging electrodes in an electrode structure in which the electrodes neighboring each other are positioned at regular intervals in the ring-like configuration so as to have an absolute value θ of a phase difference of alternating electric current in the range of 90°≦θ≦180°; and forming the ring-like arc.

A reforming process of the quartz glass crucible, the process comprising: arranging electrodes in an electrode structure in which the electrodes neighboring each other are positioned at regular interval in the ring configuration; and forming the ring-like arc, wherein the radius r of the circumference of the ring around the rotational axis of the mould is from 1 to ¼ of the radius R of an open portion of the crucible for at least a fixed time during arc heating.

In addition, the above-described production process of the present invention also includes the following production processes.

A reforming process of a quartz glass crucible, the process comprising: removing mechanically the foreign substance on the inside surface of the crucible or the bubble just under the inside surface by grinding; forming the above-described ring-like arc discharge; and fusing the inside surface of the crucible to be smoothed.

A reforming process of a quartz glass crucible, the process comprising reforming the quartz glass crucible wherein the diameter of the crucible is 28 to 40 inches.

A reforming process of a quartz glass crucible, the process comprising reforming the quartz glass crucible so that single crystal silicon is pulled up.

According to the reforming process of the present invention, the inside surface of the crucible can be heated by forming the ring-like arc along the inside surface without forming an arc crossing the central portion substantially, so that the central portion is not heated excessively, and it is possible to heat uniformly. Moreover, when the size of the ring formed with plural electrodes is within the above-described range, the suitable heating distance can be kept to the open diameter of the quartz glass crucible, and the side wall portion, the corner portion, and the bottom portion of the crucible can be heated uniformly. Therefore, for a large size quartz glass crucible having the diameter of the crucible from 28 to 40 inches, it is possible to obtain an excellent reformed crucible having a uniform refused face. In addition, the reforming process includes not only the process in which the foreign substance or the bubble on the inside surface of the crucible can be removed directly by heating to be fused, but also the process in which the inside surface of the crucible can be smoothed by forming the above-described ring-like arc discharge to fuse the inside surface, after removing mechanically the foreign substance or the bubble on the inside surface by grinding.

BRIEF DESCRIPTION OF THE DRAWINGS

The advantages of the present invention may be better understood by reference to the drawings, wherein.

DETAILED DESCRIPTION OF THE PREFERRED EMBODIMENTS

Hereinafter, the present invention will be described concretely with regard to a preferred embodiment. In addition, in the following description, the word "foreign substance" may also refer to the irregularity of the inside surface of the crucible. Moreover, in the following description, E1 to E9 are electrodes, r is the radius of the circle or ring defined by the circumference of the electrodes, R is the radius of the open diameter of the crucible, and S is the circumference of the ring.

The present invention relates to the reforming process of a quartz glass crucible in which the quartz glass crucible is reformed by an arc discharge generated by electrodes positioned around a rotational axis, which heat an inside surface of the crucible to be fused, while the quartz glass crucible is rotated. The process includes (1) arranging electrodes in an electrode structure in which the electrodes neighboring each other are positioned at regular intervals in a ring-like configuration; (2) forming a stable ring-like arc generated between the electrodes neighboring each other, without generating a continuous arc between electrodes facing each other across the central portion of the ring; (3) heating the inside surface of the crucible to be fused; and (4) removing the foreign substance on said inside surface or the bubble under the inside surface.

The reforming process of the present invention comprises the electrode structure, in which the electrodes neighboring each other are positioned at regular intervals in the ring-like configuration around the rotational axis of the mould, in order to heat uniformly the inside surface of the mould to be fused without heating excessively the bottom portion of the quartz crucible. In the electrode structure, the stable ring-like arc generated between the electrodes neighboring each other is formed without forming the continuous arc between the electrodes facing each other across the central portion of the ring, and for example, the phase difference θ (the absolute value) of the alternating electric currents between the electrodes neighboring each other in the range of $90° \leq \theta \leq 180°$. In addition, in the following descriptions, the phase difference θ between the electrodes neighboring each other is always assumed to be the absolute value. In such an electrode structure, an electrode structure having 4 electrodes with 2-phase alternating current, 6 electrodes with 3-phase alternating current, 9 electrodes with 3-phase alternating current, or 8 electrodes with 4-phase alternating current can be used. When each electrode is connected with a direct current, it is preferable that even electrodes are positioned in the ring-like configuration so as to become the electrodes neighboring each other having different phases, respectively.

Figure 1:
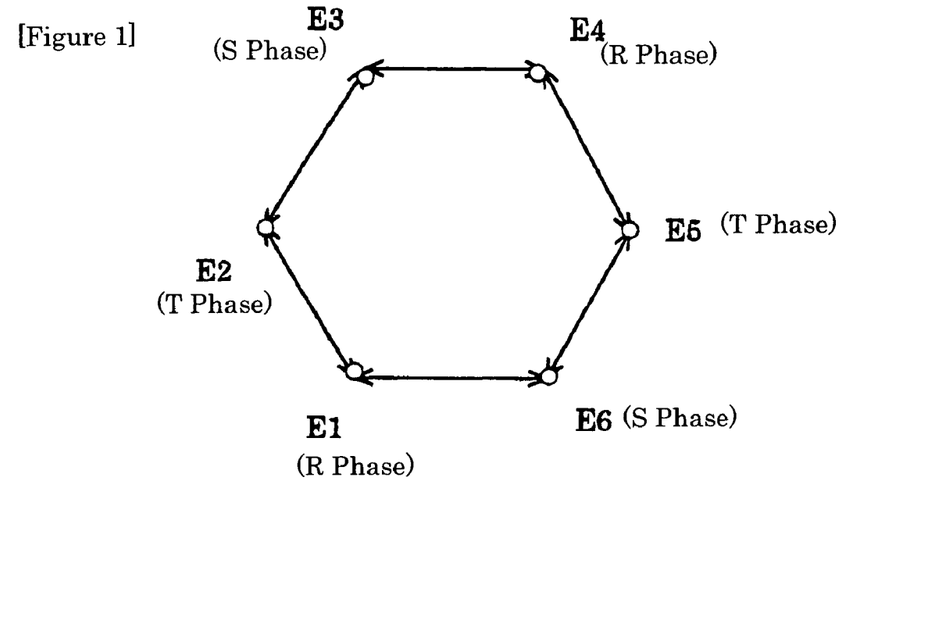
FIG. 1 shows the electrode structure having 6 electrodes with 3-phase alternating current according to the present invention.

An example of the electrode structure used in the present invention is shown in FIG. 1. In the example shown in FIG. 1, the 6 electrodes (E1 to E6) are used with the 3-phase alternating electric current. In this electrode structure, the electrodes neighboring each other are positioned at regular intervals around the rotational axis of the crucible to form a hexagonal ring connecting each electrode. With 3-phase alternating electric current, the phase difference between the electrodes neighboring each other is 120°, and the electrodes facing each other across the central portion of the ring have the same phases. More particularly, each electrode is connected as follows. Electrode E4 facing the electrode E1 across the central portion of the ring has the same R phase when the electrode E1 has the R phase of the 3-phase alternating electric current, and simultaneously, the electrodes E2 and E6, which are located on opposite sides of the electrode E1, have the T phase and the S phase, respectively, and the electrodes E3 and E5, which are located on the outer sides of the electrodes E2 and E6, have the S phase and the T phase, respectively. Therefore, the electrodes E1 and E4, the electrodes E2 and E5, and the electrodes E3 and E6 have the same respective phases, although each pair has a different phase with respect to the other electrodes.

In the electrode structure shown in FIG. 1, since the electrodes E2 and E6, which are located on opposite sides of electrode E1, have different phases than the electrode E1, the stable arc can be formed between the electrode E1 and E1's side neighbors. Therefore, the ring-like arc generated between the electrodes neighboring each other can be formed along the inside surface of the crucible. On the other hand, since the electrodes E1 and E4, which face each other across the central portion of the ring, have the same phase, the arc crossing at the central portion of the ring cannot be formed, so that the central portion of the crucible cannot be heated excessively. Moreover, in the above-described electrode structure, when the distance between the electrodes neighboring each other is increased in order to expand the heating range, an arc is formed between the electrode and its nearest neighbor, so that it is difficult to cut off the arc and it is possible to keep the stable arc. In addition, in the present invention, the ring-like arc along the inside surface of the crucible includes not only the arc formed with the electrodes sticking out on the inside of the crucible, but also the arc formed in a concentric circle on the inner peripheral face of the crucible by the electrodes positioned at the upper, open portion of the crucible.

Figure 2:
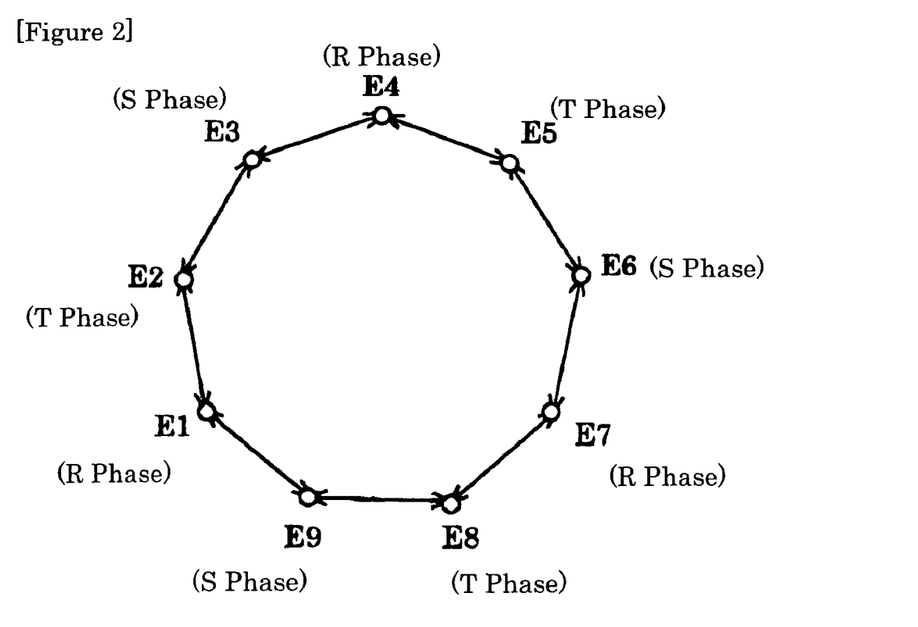
FIG. 2 shows an electrode structure having 9 electrodes with 3-phase alternating current according to the present invention.

An example using 9 electrodes (E1 to E9) with 3-phase alternating electric current is shown in FIG. 2. In this electrode structure, the electrodes neighboring each other are positioned around the rotational axis so as to have a regular interval between each other, and a nonagon ring connecting each electrode is formed. The phase difference between the electrodes neighboring each other is 120° with the 3-phase alternating electric current. More particularly, as shown in FIG. 2, when the electrode E1 has the R phase, the electrodes E2 and E9, which are located on opposite sides of the electrode E1, have the T phase and the S phase, respectively, the electrodes E3 and E5, which are located on opposite sides of the electrode E4, have the S phase and the T phase, respectively, and the electrodes E6 and E8, which are located on opposite sides of the electrode E7, have the S phase and the T phase, respectively. Simultaneously, since the electrodes E2 and E9, which are close to the electrode E1, have a phase difference with respect to the electrode E1, a stable arc can be formed between the electrode E1 and the electrodes E2 and E9. However, since the electrodes E4 and E7, which are facing the electrode E1 across the central portion of the ring-like arc, have the same phase as the electrode E1, an arc cannot be formed between these electrodes. In addition, the electrodes E3 and E8, which are next closer to the electrode E1, and the electrodes E5 and E6, which are facing the electrode E1 across the central portion of the ring-like arc, have a phase difference with respect to the electrode E1. However, since the distances between the electrode E1 and the electrodes E3, E8, E5, and E6 are larger than the distance between E1 and the electrodes E2 and E9, if the arc is generated temporarily between these electrodes and the electrode E1, the arc cannot be kept and a stable arc cannot be formed. Therefore, the arc crossing the central portion encircled by the electrodes cannot be formed substantially, and the ring-like arc being generated between the electrodes neighboring each other can be formed. Commonly, in the electrode structure having 3 n electrodes with 3-phase alternating current ($n \geq 4$), the ring-like arc generated between the electrodes neighboring each other can be formed according to the above-description, and the stable arc crossing the central portion of the ring is not substantially formed.

Figure 3:
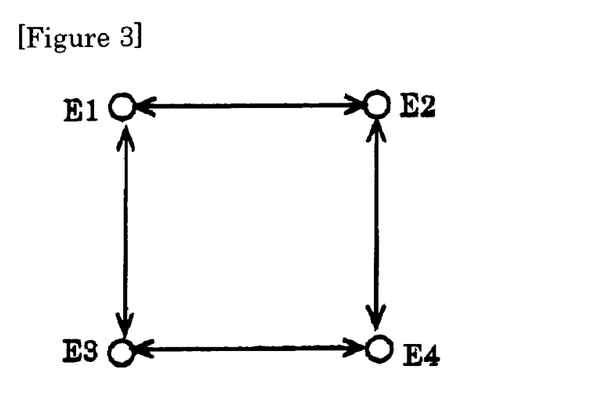
FIG. 3 shows the electrode structure having 4 electrodes with 2-phase alternating current according to the present invention.

The example using 4 electrodes (E1 to E4) with 2-phase alternating electric current is shown in FIG. 3. In this electrode structure, the electrodes neighboring each other are positioned at regular intervals around the rotational axis of the mould so as to form a square ring connecting each electrode. Since the phase difference between the electrodes neighboring each other is 180° with the 2-phase alternating electric current, the arc is generated between the electrodes neighboring each other. However, since the electrodes facing each other across the central portion of the ring have the same phases, the arc is not generated between these electrodes, and the arc crossing the central portion of the ring cannot be formed. Commonly, in the electrode structure having 2 n electrodes 2-phase alternating current ($n \geq 3$), the ring-like arc being generated between the electrodes neighboring each other is formed like the above description, and the stable arc crossing at the central portion of the ring is not formed substantially.

Figure 4:
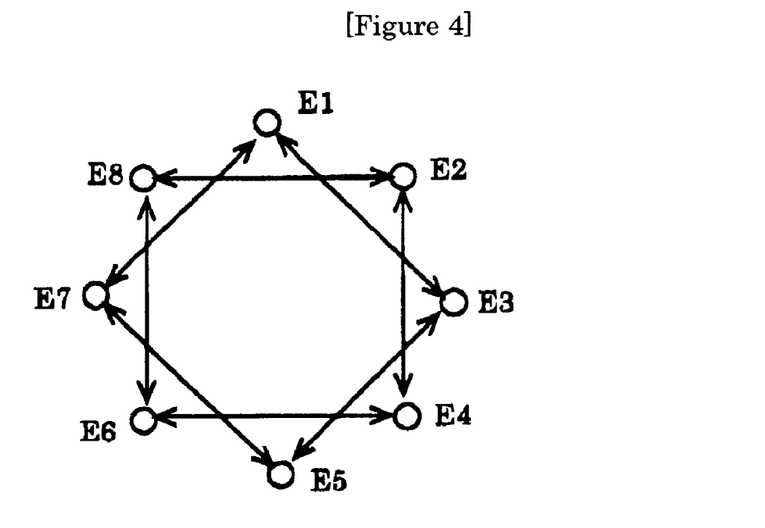
FIG. 4 shows the electrode structure having 8 electrodes with 4-phase alternating current according to the present invention.

An example using 8 electrodes (E1 to E8) with 4-phase alternating electric current is shown in FIG. 4. In this electrode structure, the electrodes neighboring each other are positioned at regular intervals around the rotational axis of the mould to form an octagonal ring connecting each electrode. With 4-phase alternating electric current, the phase difference between the electrodes neighboring each other is 90°, and the phase difference between the electrodes that are next closest to each other is 180°. Since the arc is generated mainly between the electrodes having the large phase difference, the arc is generated between the electrodes that are next closest to each other in this structure. Thus, the ring-like arc can be formed between the electrodes that are next closest to each other. In the present invention, the ring-like arc generated between the electrodes neighboring each other includes the ring-like arc generated between the electrodes that are next closest to each other. On the other hand, since the electrodes facing each other across the central portion of the ring have the same phases, an arc is not formed between these electrodes. Moreover, if the arc is generated temporarily between the facing electrodes having the phase difference across the central portion of the ring, the distance between the electrodes is large, so that the arc is not kept. Thus, the stable arc cannot be formed substantially.

Further, in the conventional structure having 6 electrodes with 6-phase alternating current, which is shown in FIG. 6, the phases of the electric current of electrodes E2 to E6 have been shifted from the electrode E1 by of 60°, and the phase difference between the electrode E1 and the electrode E4, positioned at the opposite side of the electrode E1, becomes the largest value, i.e., 180°. It is easy to generate an arc between the electrodes having the largest phase difference of the electric currents. Thus, in the conventional electrode structure, an arc is generated between the electrodes E1 and E4, E2 and E5, and E3 and E6, which face each other (at the diagonal line position), and are crossed at the central portion encircled with the electrode E2 to the electrode E6. Furthermore, in the conventional electrode structure, when the distance between the electrodes neighboring each other is increased, the distance between the electrodes facing each other must be increased sharply, so that the arc becomes unstable and can be cut off easily. On the other hand, in the electrode structure of the present invention, since the ring-like arc generated between the electrodes neighboring each other can be formed when the distance between the electrodes is increased, it is difficult to cut off the arc and is possible to keep a stable arc.

Figure 5:
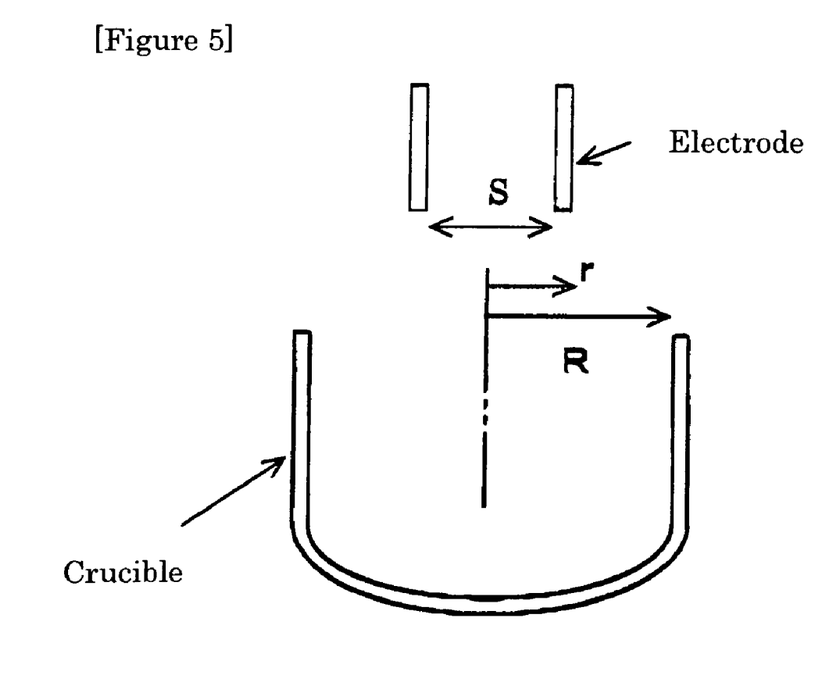
FIG. 5 shows the relationship between the diameter of a circumference defined by the arrangement of the electrodes and the open diameter of the crucible.

Next, as shown in FIG. 5, for the size of the ring formed by connecting the electrodes (E1 to E6), it is preferable that the radius r of the circumference S, which is the circumference of the ring around the rotational axis, is from 1 to ¼ to the radius R of the open portion of the crucible, at least for a fixed time at the time of arc heating. In this range, heating can be uniform from the sidewall portion to the corner portion and the bottom portion of the crucible. On the other hand, if the radius r of the circumference S, in which the electrodes are positioned, is larger than the radius R of the open of the crucible, the electrode can not be inserted into the inside of the crucible so that the bottom portion of the crucible can not be heated sufficiently. Moreover, if the radius r of the circumference is smaller than ¼ of the radius R of the open portion of the crucible, the side wall portion of the crucible can not be heated sufficiently.

In the reforming process of the present invention, in which the electrode structure having 6 electrodes with 3-phase alternating current is used, when the arc heating is carried out from the upper side of the mould, the above-described effect is especially remarkable. At the time of the arc fusion, a large air stream is aroused around the crucible by an exhaust gas of a furnace or convection at the inside of the crucible. When the arc heating is carried out from the upper side of the mould, the air stream has a great influence. Thus, the arc is cut off immediately with the 3 electrodes when the distance between the electrodes is increased. On the other hand, for the structure having 6 electrodes with the 3-phase alternating current, when the arc heating is carried out from the upper side of the mould, it is possible to obtain a stable arc. Therefore, for the large size quartz glass crucible having a diameter of the crucible from 28 to 40 inches, it is possible to obtain an excellent reformed crucible having a uniform refused face.

In the reforming process of the present invention, the heating temperature by the arc discharge is in a temperature range in which the inside surface of the crucible can be refused without deforming the crucible. In addition, as needed, the air is passed on an outer face of the crucible at the time of the arc heating to carry out air cooling. By such air-cooling, it is possible to prevent the deformation of the crucible more certainly.

Moreover, the above-described reforming process of the present invention includes not only the process in which the foreign substance or the bubble on the inside surface of the crucible can be removed directly by fusing, but also the process in which the foreign substance or the bubble on the inside surface can be removed mechanically by grinding, after which the inside surface of the crucible can be fused by forming the above-described ring-like arc discharge to be smoothed. For example, when the foreign substance, such as silica or a metal powder (impurity), adheres to the inside surface of the crucible, if the foreign substance is present in a depth of about less than 0.2 mm from the inside surface of the crucible, it is possible to remove the foreign substance by the above-described arc fusion, without carrying out the mechanical grinding. If the foreign substance is present in a depth of about more than 0.2 mm from the inside surface, it is preferable that the inside surface of the crucible is smoothed by the above-described arc fusion after carrying out the mechanical grinding.

EXAMPLES

Hereinafter, the present invention is further explained by way of the examples.

Example 1

For a quartz glass crucible having a diameter of the crucible of 32 inches, the treatment for removing the bubble just under the inside surface was carried out using (1) the heating devices having 6 electrodes with 3-phase alternating current, in which the radius r of the ring formed with the electrodes could be expanded to more than ¼ of the radius R of the crucible, (2) the conventional 3 electrodes with 3-phase alternating current, and (3) 6 electrodes with 3-phase alternating current, wherein electric power was given for 10 minutes. Moreover, a test of pulling up single crystal silicon was carried out. These results are shown in Table 1.

For the reforming treatment of the present invention, in which the heating device having 6 electrodes with 3-phase alternating current was used, since the distance between the electrodes could be increased according to the above description, it was possible to reduce the bubbles at the bottom portion and the wall portion of the crucible. On the other hand, as for the comparison examples, in which electrode structures having 3 electrodes with 3-phase alternating current and 6 electrodes with 6-phase alternating current were used, it was possible to remove the bubble at the bottom portion of the crucible. However, when the radius r was expanded to more than ¼ to the radius R of the crucible, the arc was cut off or became unstable, so that it was impossible to remove the bubble on the sidewall portion of the crucible.

TABLE 1

| | Diameter of Circumference | Bubble Content before Reforming Treatment | | Bubble Content after Reforming Treatment | | Dislocation Free Ratio of Single Crystal | Evaluation |
| --- | --- | --- | --- | --- | --- | --- | --- |
| | | Wall Portion | Bottom Portion | Wall Portion | Bottom Portion | | |
| Example 1 6 electrodes with 3-phase alternating current | Change in the range from 100 to 500 mm | 0.50% | 0.30% | 0.03% | 0.01% | 80% | ☺ |
| Comparison Example 1 3 electrodes with 3-phase alternating current | 50 mm | 0.50% | 0.30% | 0.50% | 0.01% | 20% | x |
| Comparison Example 2 Non-reformed Product | 150 mm | 0.50% | 0.30% | 0.40% | 0.01% | 30% | x |

Example 2

For the quartz glass crucible having the diameter of the crucible of 32 inches, the treatment for removing the foreign substance was carried out, using the heating devices having 6 electrodes with 3-phase alternating current shown in the FIG. 1 and the conventional 3 electrodes with 3-phase alternating current (Comparison Example 1), wherein the electric power was given for 10 minutes. Moreover, a test of pulling up the single crystal silicon was carried out. These results were shown in Table 2. In addition, the result of the non-reformed product is shown as the Comparison Example 2.

For Example 2, in which the reforming treatment of the present invention was carried out, the foreign substances on the wall portion and the bottom portion of the crucible were removed completely, and the dislocation free ratio of the single crystal at the time of using the reformed crucible was 80%, which is a high dislocation free ratio. On the other hand, for Comparison Example 1, in which 3-phase alternating current flowed to the conventional 3 electrodes, the contamination part at the wall portion was hardly removed, and the dislocation free ratio of the single crystal was 45%, which is low. In addition, in the case of the reforming treatment of Comparison Example 1, when the amount of the flowing current was set to two times, in order to increase the treatment effect, the crucible was deformed, so that the crucible could not be used for pulling up the single crystal, and as a result, it was impossible to remove the foreign substance or the bubble at the wall portion.

TABLE 2

| | Number of Foreign Substances before Reforming Treatment | | Number of Foreign Substances after Reforming Treatment | | Dislocation Free Ratio of | |
|---|---|---|---|---|---|---|
| | Wall Portion | Bottom Portion | Wall Portion | Bottom Portion | Single Crystal | Evaluation |
| Example 2 6 electrodes with 3-phase alternating current | 24 | 17 | 0 | 0 | 80% | ◎ |
| Comparison Example 2-1 3 electrodes with 3-phase alternating current | 24 | 17 | 22 | 0 | 45% | x |
| Comparison Example 2-2 Non-reformed Product | 24 | 17 | — | — | 30% | x |

[Note]
As for Comparison Example 1, when the amount of the flowing current was set to two times, the crucible was deformed.
As for Evaluation, ◎ is sufficient, and x is insufficient.

According to the reforming process of the present invention, the arc is stable and the heating range is large. In addition, it is possible to heat uniformly from the sidewall portion to the bottom portion without heating the bottom portion excessively. Therefore, it is possible to re-fuse the inside surface of the crucible to remove the foreign substance or the bubble on the inside surface, and to form the uniform re-fused face on the whole inside surface of a large size crucible, so that it is possible to obtain an excellent reformed crucible.

The invention claimed is:

1. A process of reforming a quartz glass crucible, wherein the quartz glass crucible is reformed by an arc discharge generated by electrodes positioned around a rotational axis and configured to heat an inside surface of the crucible while the crucible is rotated, the process comprising:
   using an electrode structure having 3 n electrodes with 3-phase alternating electric current, n being equal to or larger than 2, wherein neighboring electrodes are positioned at regular intervals from each other in a ring-like configuration so as to form a stable ring-like arc between the neighboring electrodes, without generating a continuous arc between electrodes facing each other across a central portion of the ring-like configuration;
   heating the inside surface of the crucible while the crucible is rotated, wherein a diameter of the crucible is 28 inches or more, and a radius r of the ring-like configuration around the rotational axis is at least ¼ of a radius R of an open portion of the crucible, but not greater than R, for at least a fixed time during arc heating, wherein air is passed on an outer face of the crucible at a time of the arc heating to perform air cooling; and
   removing one of a foreign substance located on the inside surface and a bubble located under the inside surface by arc discharge.

2. The process of claim 1, wherein the using step comprises:
   arranging the electrodes in the electrode structure such that the neighboring electrodes are positioned at regular intervals in the ring-like configuration so as to have an absolute value θ of a phase difference of the alternating electric current in the range of $90° \leq \theta \leq 180°$.

3. The process of claim 2, wherein a diameter of the crucible is 28 to 40 inches.

4. The process of claim 2, wherein the quartz glass crucible is used for the pulling up of single crystal silicon.

5. The process of claim 1, wherein a diameter of the crucible is 28 to 40 inches.

6. The process of claim 1, wherein the quartz glass crucible is used for the pulling up of single crystal silicon.

7. The process of claim 1, wherein if the foreign substance is present in a depth of about less than 0.2 mm from the inside surface of the crucible, the foreign substance is removed without carrying out mechanical grinding, and if the foreign substance is present in a depth of about more than 0.2 mm from the inside surface, the inside surface of the crucible is smoothed by arc fusion after carrying out mechanical grinding.

8. A process of reforming a quartz glass crucible, comprising:
   one of mechanically removing a foreign substance on an inside surface of the crucible and removing a bubble just under the inside surface of the crucible by grinding;
   using an electrode structure having 3n electrodes with 3-phase alternating electric current, n being equal to or larger than 2, wherein neighboring electrodes are positioned at regular intervals from each other in a ring-like configuration so as to form a ring-like arc between neighboring electrodes, without generating a continuous arc between electrodes facing each other across a central portion of the ring-like configuration, wherein a diameter of the crucible is 28 inches or more, and a radius r of the ring-like configuration around the rotational axis is at least ¼ of a radius R of an open portion of the crucible, but not greater than R, for at least a fixed time during arc heating, wherein air is passed on an outer face of the crucible at a time of the arc heating to perform air cooling; and fusing the inside surface of the crucible to be smoothed.

9. The process of claim 8, wherein a diameter of the crucible is 28 to 40 inches.

10. The process of claim 8, wherein the quartz glass crucible is used for the pulling up of single crystal silicon.

11. A process of reforming a quartz glass crucible, wherein the quartz glass crucible is reformed by an arc discharge generated by electrodes positioned around a rotational axis and configured to heat an inside surface of the crucible while the crucible is rotated, the process comprising:

using an electrode structure having 2n electrodes with 2-phase alternating electric current, n being equal to or larger than 2, wherein neighboring electrodes are positioned at regular intervals from each other in a ring-like configuration so as to form a stable ring-like arc between the neighboring electrodes, without generating a continuous arc between electrodes facing each other across a central portion of the ring-like configuration;

heating the inside surface of the crucible while the crucible is rotated, wherein a diameter of the crucible is 28 inches or more, and a radius r of the ring-like configuration around the rotational axis is at least ¼ of a radius R of an open portion of the crucible, but not greater than R, for at least a fixed time during arc heating, wherein air is passed on an outer face of the crucible at a time of the arc heating to perform air cooling; and removing one of a foreign substance located on the inside surface and a bubble located under the inside surface by arc discharge.

12. The process of claim 11, wherein if the foreign substance is present in a depth of about less than 0.2 mm from the inside surface of the crucible, the foreign substance is removed without carrying out mechanical grinding, and if the foreign substance is present in a depth of about more than 0.2 mm from the inside surface, the inside surface of the crucible is smoothed by arc fusion after carrying out mechanical grinding.

13. A process of reforming a quartz glass crucible, wherein the quartz glass crucible is reformed by an arc discharge generated by electrodes positioned around a rotational axis and configured to heat an inside surface of the crucible while the crucible is rotated, the process comprising:

using an electrode structure having 8 electrodes with 4-phase alternating electric current, wherein neighboring electrodes are positioned at regular intervals from each other in a ring-like configuration so as to form a stable ring-like arc between the neighboring electrodes, without generating a continuous arc between electrodes facing each other across a central portion of the ring-like configuration heating the inside surface of the crucible while the crucible is rotated, wherein a diameter of the crucible is 28 inches or more, and a radius r of the ring-like configuration around the rotational axis is at least ¼ of a radius R of an open portion of the crucible, but not grater than R, for at least a fixed time during arc heating, wherein air is passed on an outer face of the crucible at a time of the arc heating to perform air cooling; and removing one of a foreign substance located on the inside surface and a bubble located under the inside surface by arc discharge.

14. The process of claim 13, wherein if the foreign substance is present in a depth of about less than 0.2 mm from the inside surface of the crucible, the foreign substance is removed without carrying out mechanical grinding, and if the foreign substance is present in a depth of about more than 0.2 mm from the inside surface, the inside surface of the crucible is smoothed by arc fusion after carrying out mechanical grinding.

* * * * *

UNITED STATES PATENT AND TRADEMARK OFFICE
CERTIFICATE OF CORRECTION

| | |
|---|---|
| PATENT NO. | : 7,905,112 B2 |
| APPLICATION NO. | : 10/628350 |
| DATED | : March 15, 2011 |
| INVENTOR(S) | : Masanori Fukui et al. |

It is certified that error appears in the above-identified patent and that said Letters Patent is hereby corrected as shown below:

On the title page, Item (30), the Foreign Application Priority Data has been omitted. Item (30) should read:

-- (30)    Foreign Application Priority Data

Aug. 15, 2002    (JP) ............................ 2002-237039
Jan. 29, 2003    (JP) ............................ 2003-021196 --

Signed and Sealed this
Tenth Day of May, 2011

David J. Kappos
*Director of the United States Patent and Trademark Office*